United States Patent [19]
Strauss

[11] 3,836,404
[45] Sept. 17, 1974

[54] METHOD OF FABRICATING COMPOSITE SUPERCONDUCTIVE ELECTRICAL CONDUCTORS

[75] Inventor: Bruce P. Strauss, Downers Grove, Ill.

[73] Assignee: The United States of America as represented by the United States Atomic Energy Commission, Washington, D.C.

[22] Filed: June 28, 1972

[21] Appl. No.: 266,901

[52] U.S. Cl. ......... 148/11.5 R, 29/599, 148/11.5 F, 148/127, 148/133, 174/126 CP, 174/DIG. 6
[51] Int. Cl. .............................................. H01v 11/14
[58] Field of Search ... 29/599; 174/126 CP, DIG. 6; 148/13.2, 127, 11.5 F, 11.5 R, 133

[56] References Cited

UNITED STATES PATENTS

| | | | |
|---|---|---|---|
| 3,358,361 | 12/1967 | Kolbe | 29/599 |
| 3,509,622 | 5/1970 | Bernert et al. | 29/599 |
| 3,625,662 | 12/1971 | Roberts et al. | 29/599 X |
| 3,694,270 | 9/1972 | Pfisterer et al. | 148/11.5 R |
| 3,728,165 | 4/1973 | Howlett | 148/11.5 R |
| 3,731,374 | 5/1973 | Svenaga et al. | 29/599 |
| 3,759,750 | 9/1973 | Muller et al. | 148/11.5 R X |

FOREIGN PATENTS OR APPLICATIONS

| | | | |
|---|---|---|---|
| 1,039,316 | 8/1966 | Great Britain | 29/599 |
| 1,021,548 | 3/1966 | Great Britain | 29/599 |

*Primary Examiner*—Charles W. Lanham
*Assistant Examiner*—D. C. Reiley, III
*Attorney, Agent, or Firm*—John A. Horan; Arthur A. Churm; James W. Weinberger

[57] ABSTRACT

A method of fabricating composite superconductive electrical conductors by disposing at least one rod of flexible substrate material into a billet of an alloy of a normal metal and an alloying metal, co-drawing the billet and rod down to form an elongated conductor and heating the conductor to diffuse the alloying metal into the surface of the flexible substrate, forming a layer of superconductive material in the flexible substrate surrounded by a sheath of normal metal alloy. By this method, composite conductors containing any number of superconductive filaments can be fabricated.

1 Claim, No Drawings

METHOD OF FABRICATING COMPOSITE SUPERCONDUCTIVE ELECTRICAL CONDUCTORS

CONTRACTUAL ORIGIN OF THE INVENTION

The invention described herein was made in the course of, or under, a contract with the UNITED STATES ATOMIC ENERGY COMMISSION.

BACKGROUND OF THE INVENTION

This invention relates to a method of manufacturing superconductive conductors. More specifically, this invention relates to a method of manufacturing composite superconductive conductors wherein a superconducting layer is disposed on a flexible core or substrate surrounded by a layer of normal metal.

As the requirements for larger electromagnets with higher magnetic fields increase, the importance of superconducting magnets increases. Of particular importance in making these magnets are the "hard" superconductors, that is, superconductors which remain superconductive in the presence of intense magnetic fields. Examples of these hard superconductors are $Nb_3Sn$, $V_3Ga$ and $Nb_3Al$. Because these hard superconductors are brittle and have substantially no plastic deformation characteristics, the manufacture of wire or cable having superconductive properties is difficult, since any break in the superconductor material will destroy the desirable characteristics of the conductor. The superconductive conductors are often surrounded by a sheath of a "normal" metal, that is, a metal having high thermal and electrical conductivity at superconducting temperatures.

Present methods of fabricating superconductive conductors include filling a niobium tube with niobium and aluminum powder or niobium and tin powder and drawing the niobium tube to form a hollow wire containing a compressed powder and sintering to form an integral core of superconductive material coated with niobium. In a similar method, powder of superconductive material is placed into a hollow in a billet of normal metal and drawn to form a wire of normal metal surrounding a powdered superconductive core which is packed tightly enough to eliminate the necessity of sintering. In still another method, a core of superconductive alloy is disposed in a sleeve of normal metal and alternately cold-reduced and annealed to form a superconductive conductor. Vapor phase reactions in which a superconductor layer is formed in a flexible substrate can also be used to form superconductive conductors.

Many problems are associated with conductors formed by the above-described methods. Many of the conductors so formed are brittle and must be wound into coils or other desired shapes and then heated to form the superconductive material, since any stress on the brittle superconductor could destroy the continuity, thus rendering the coil worthless. Vapor phase deposited thin-film types of conductors do not lend themselves to the formation of composite superconductors, that is, superconductors where the superconducting material is embedded in a low-resistance normal metal because of difficulty in cladding the conductor with normal metal. The use of a composite conductor eliminates the need for protective circuitry, since the normal metal acts as a shunt should the superconductor be driven normal during its use, preventing the creation of forces and/or the generation of heat which may destroy the coil.

SUMMARY OF THE INVENTION

I have developed a method for fabricating composite superconductive electrical conductors which eliminates many of the problems associated with prior art methods of manufacture. By the method of my invention, a billet is prepared of an alloy of a normal metal and an alloying metal having at least one rod of a flexible superconductor substrate material disposed therein to form a composite billet, the composite billet is then cold-reduced to form an elongated conductor which is then heated in an inert atmosphere for a period of time to diffuse a portion of the alloying metal into the surface of the flexible superconductor substrate to form a layer of superconductive material thereon, thus forming an elongated composite superconductive electrical conductor. By this method, a cable having a number of filaments of superconductive material can be fabricated by disposing a plurality of uniformly spaced parallel rods within the billet before it is cold-reduced. If necessary, a stainless steel rod can also be disposed within the billet and co-drawn with the billet and superconductor substrate rods to provide additional strength in the cable.

Accordingly, it is one object of the present invention to provide an improved method for making superconductive conductors.

It is another object of this invention to provide an improved method for making flexible composite superconductive conductors.

It is still another object of this invention to provide an improved method for making composite superconductive conductors containing one or more superconducting filaments.

Other objects of the present invention will become more apparent as the detailed description proceeds.

DESCRIPTION OF THE PREFERRED EMBODIMENT

These and other objects of the invention may be attained by preparing a billet from an alloy of a normal metal and 5 to 25 w/o of an alloying metal, disposing at least one rod of flexible superconductor substrate material therein to form a composite billet and cold-reducing the composite billet to a predetermined cross-sectional size to form an elongated electrical conductor, heating the conductor in an inert atmosphere to a temperature of from 750° to 1,000°C. and maintaining the temperature for at least about four hours to diffuse a portion of the alloying metal into the surface of the flexible superconductor substrate material to form a layer of a hard superconductive conductor on the surface of the flexible substrate surrounded by a sheath of normal metal alloy. The superconductive electrical conductors so formed may be further heated in a vacuum to remove the alloying metal from the normal metal alloy, leaving a porous normal metal sheath surrounding the superconductive surface.

The normal metal in the alloy from which the billet is formed may be either copper or aluminum, while the alloying metal may be tin, gallium or aluminum. However, it is obvious that the normal metal and the alloying metal must not be the same. The amount of alloying metal necessary to prepare the alloy depends upon the metals involved. While it is desirable to have as much alloying metal in the alloy as possible, too much alloying metal will give the alloy a low work hardening coefficient, making it difficult to cold-reduce. Thus the alloy may contain from about 5 to about 25 weight percent (w/o) gallium, from 2 to 9 w/o tin and from about 10 to 15 w/o aluminum. Germanium may be substituted for some of the aluminum alloying metal in a ratio of about 1 part gallium to 3 parts aluminum, although the total concentration should not exceed about 15 w/o.

The flexible superconductive substrate material which may be used with the process of this invention includes niobium and vanadium.

It is obvious that the "hard" superconductor desired will affect the choice of normal metal alloy constituents and flexible superconductor substrate. Thus, for example, $Nb_3Sn$ is formed from an alloy of copper with tin as the alloying metal and niobium as the flexible superconductive substrate, while by using a copper-gallium alloy with a vanadium flexible substrate rod, $V_3Ga$ will be formed. A copper-aluminum alloy with a niobium substrate will form $Nb_3Al$ or, if some germanium is substituted for some aluminum, the hard superconductor is $Nb_3(Al_xGe_{1-x})$ where $x \cong 0.75$.

After formation of the billet, any number of rods of flexible superconductor substrate may be disposed therein to form the composite billet before cold-reducing. By use of a single rod, a superconductor wire may be formed. By disposing a plurality of uniformly spaced parallel rods into the billet, a superconducting cable may be formed. If additional strength is required, a rod of stainless steel can also be disposed in the billet and co-drawn with the billet and flexible substrate material.

The method of cold-reducing the composite billet may be by any method known to those skilled in the art, such as co-reduction or co-drawing, and forms no part of the present invention. The amount of reducing is dependent upon the cross-sectional size that is desired. In general, for a single filament superconductor an over-all conductor diameter of about 0.010 inch is preferred.

After the composite billet has been reduced to the desired cross-sectional size to form an elongated electrical conductor, it is necessary to treat the conductor to diffuse a portion of the alloying metal into the surface of the flexible substrate to form the "hard" superconductor thereupon. In general, this is achieved by heating the conductor to about 750° to 1,000°C. in an inert atmosphere such as argon for a period of time sufficient to complete the desired diffusion. The time is inversely proportional to the temperature and is a function of inter-diffusion constants which vary with the composition of the normal metal alloy and the superconductor substrate being used. In general, at least four hours will be necessary to accomplish the diffusion at 1,000°C. and the time may be as high as 70–80 hours at 750°C. Also important is heat treatment or annealing of the conductor to provide minimum contact resistance and to enhance the superconducting properties of the superconductive material. This heat treatment which may be a continuation of the diffusion step is known to those skilled in the art and forms no part of the present invention.

If the superconductor is to be used for A.C. magnets, it is generally not necessary to remove the alloying metal from the normal metal alloy because of the desirability of higher resistivity in the normal metal which the superconducting contaminant provides. If, however, the cable is to be used for certain applications, for example, in D.C. magnets, it may be necessary to remove the alloying metal from the normal metal alloy by heating the superconducting wire or cable in a vacuum to a temperature of 1,500°–1,750°C. for about five minutes to diffuse the alloying metal from the normal metal, resulting in a normal metal layer that is now porous. This may improve the ability of superfluid liquid helium to cool the superconductor layer through the porous normal metal.

The cable may also be twisted about its axis, giving the filaments a helical twist to decouple or reduce cross coupling between the individual filaments.

EXAMPLE I

A ½-inch-diameter billet was prepared of copper and 10 w/o aluminum. A ¼-inch-diameter niobium rod was disposed in the single axial aperture. The billet and rod were co-reduced until the billet was about 3/32 inch in diameter and the rod was about 3/63 inch in diameter, forming an elongated conductor. The conductor was heated in an argon atmosphere at 1,000°C. for 10 hours until a 1-mil-thick interface of $Nb_3Al$ was formed between the outer surface of the rod and the inner surface of the billet. A short sample of the superconductor thus formed was tested and found to have a critical temperature of 18.5° ± 5°K at a critical field of about 100 K gauss.

EXAMPLE II

A ½-inch-diameter billet is prepared of a copper – 25 w/o gallium and a ¼-inch-diameter vanadium rod is disposed within the center thereof. The billet and rod are co-drawn until the vanadium is about 5 mil in diameter and the over-all diameter of the conductor is about 10 mil. The conductor is heated in an argon atmosphere for about 4 hours at 1,000°C. until about a 1-mil interface of $Va_3Ga$ is formed between the vanadium substrate material and the Cu/Ga alloy. A short sample of the superconductive conductor is tested and is found to have a critical field of 100 K gauss and a critical temperature of 14°K.

EXAMPLE III

A billet is prepared as previously described of copper containing 12 w/o aluminum and 4 w/o germanium. A rod of niobium is disposed within the billet and the billet and rod are co-drawn until the billet is about 10 mil in diameter to form an elongated conductor. The conductor is heated to 1,000°C. and held at this temperature for about 10 hours to diffuse the aluminum and germanium into the niobium and to anneal the metals. When diffusion is completed, the conductor is cooled and tested to find that a layer of $Nb_3(Al_{.75}Ge_{.25})$ is formed between the niobium rod and normal metal alloy. A short sample is tested and found to have a critical field in excess of 400 K gauss and a critical temperature of 20°K.

The embodiments of the invention in which an exclusive property or privilege is claimed are defined as follows:

1. A method of fabricating an elongated composite electrical conductor comprising: preparing a billet of uniform composition from an alloy of copper and 10 w/o aluminum, said billet having at least one aperture therein, disposing a rod of niobium in each aperture in said billet to form a composite billet, cold reducing said composite billet to a predetermined cross-sectional size, thereby forming an elongated electrical conductor, heating said conductor in an argon atmosphere at 1,000°C. for 10 hours to diffuse the aluminum into the surface of the niobium thereby forming a layer of $Nb_3Al$ thereon, thus forming an elongated composite superconductive electrical conductor, and heating the composite superconductive electrical conductor in a vacuum at a temperature of from 1,500° to 1,750°C. for about 5 minutes to remove the aluminum from the alloy, thereby leaving a porous normal metal sheath surrounding the superconductive layer.

* * * * *